United States Patent
Moriya

(10) Patent No.: US 7,913,351 B2
(45) Date of Patent: Mar. 29, 2011

(54) CLEANING APPARATUS AND CLEANING METHOD

(75) Inventor: Tsuyoshi Moriya, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 98 days.

(21) Appl. No.: 11/844,748

(22) Filed: Aug. 24, 2007

(65) Prior Publication Data

US 2008/0047585 A1  Feb. 28, 2008

Related U.S. Application Data

(60) Provisional application No. 60/844,077, filed on Sep. 13, 2006.

(30) Foreign Application Priority Data

Aug. 28, 2006  (JP) .................................. 2006-231293

(51) Int. Cl.
  *A47L 7/00* (2006.01)
(52) U.S. Cl. ................. 15/320; 15/322; 15/345; 15/346; 15/415.1; 15/416; 15/420
(58) Field of Classification Search .................... 15/320, 15/322, 323, 344–346, 415.1, 416, 420; *A47L 7/00*
  See application file for complete search history.

(56) References Cited

U.S. PATENT DOCUMENTS

| | | | | |
|---|---|---|---|---|
| 4,270,238 A | * | 6/1981 | Shallenberg et al. | 15/321 |
| 5,786,561 A | * | 7/1998 | Zefferer et al. | 219/121.84 |
| 5,918,817 A | | 7/1999 | Kanno et al. | |
| 7,578,886 B2 | * | 8/2009 | Yamada et al. | 134/21 |
| 2004/0079387 A1 | * | 4/2004 | Mori | 134/2 |
| 2004/0177469 A1 | * | 9/2004 | Sadaune et al. | 15/322 |
| 2006/0037171 A1 | * | 2/2006 | Guest et al. | 15/322 |
| 2006/0225241 A1 | * | 10/2006 | Phillips | 15/322 |
| 2008/0178415 A1 | * | 7/2008 | Hall | 15/322 |

FOREIGN PATENT DOCUMENTS

| | | |
|---|---|---|
| CN | 1184715 A | 6/1998 |
| CN | 1721091 A | 1/2006 |
| JP | 62-188322 | 8/1987 |
| JP | 5-57257 | 3/1993 |
| JP | 2006-5344 | 1/2006 |
| TW | 402528 | 8/2000 |

OTHER PUBLICATIONS

Office Action issued Sep. 2, 2010, in China Patent Application No. 200710147767.7 (with English translation).

* cited by examiner

*Primary Examiner* — David A Redding
(74) *Attorney, Agent, or Firm* — Oblon, Spivak, McClelland, Maier & Neustadt, L.L.P.

(57) ABSTRACT

A cleaning apparatus which can efficiently and satisfactorily clean component parts facing narrow spaces. A mixture of a substance in gaseous form and the same substance in liquid form or solid form as the former is jetted out from a jet pipe toward deposits attached to a structural object. The jetted mixture and the deposits to which the mixture has been jetted are sucked into a suction pipe.

13 Claims, 8 Drawing Sheets

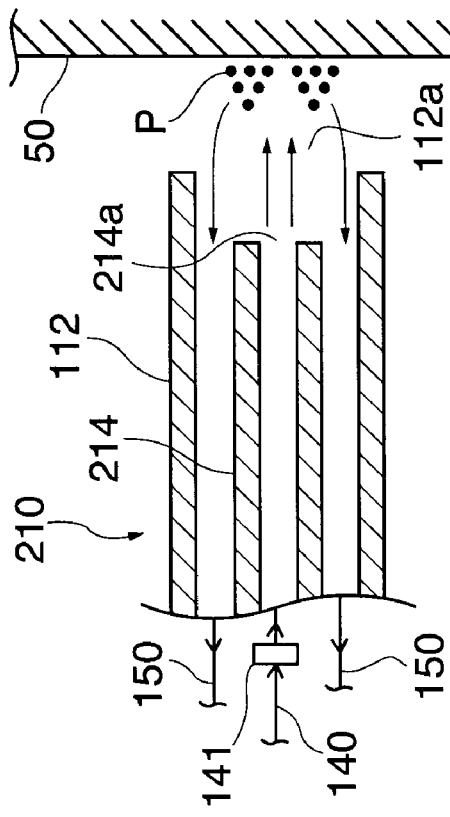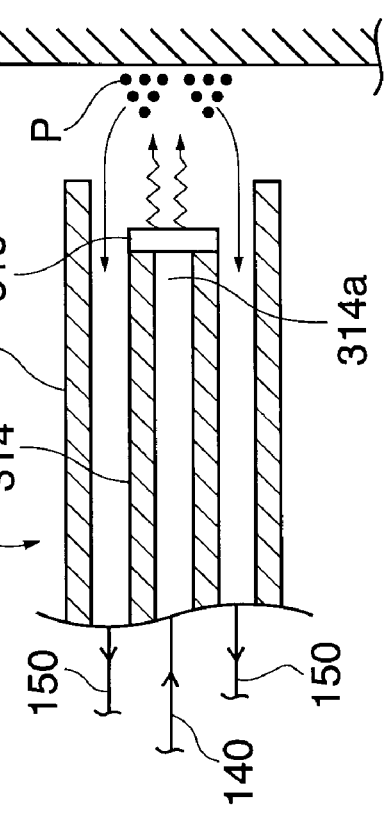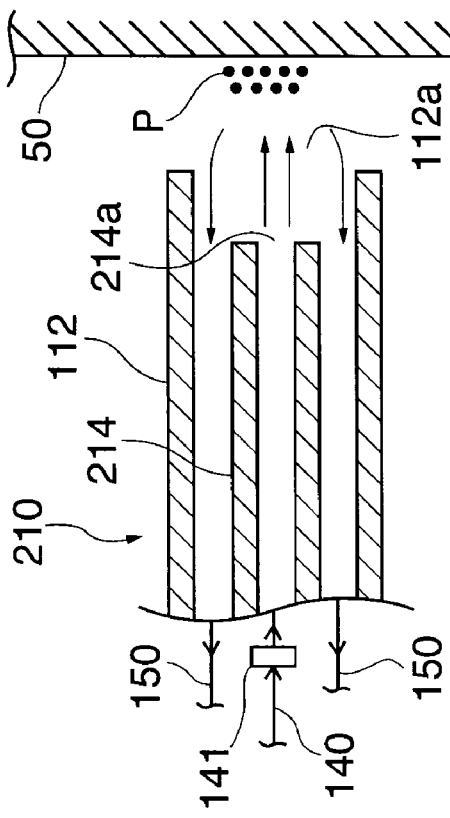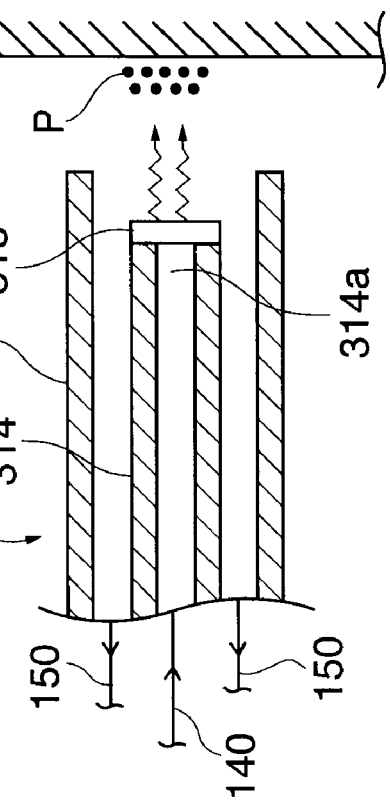

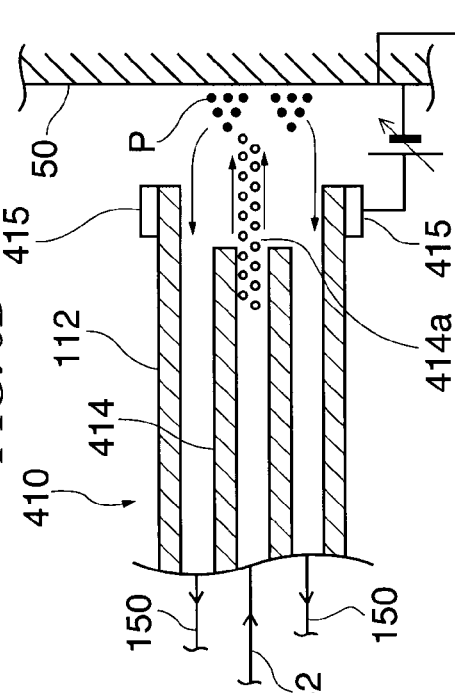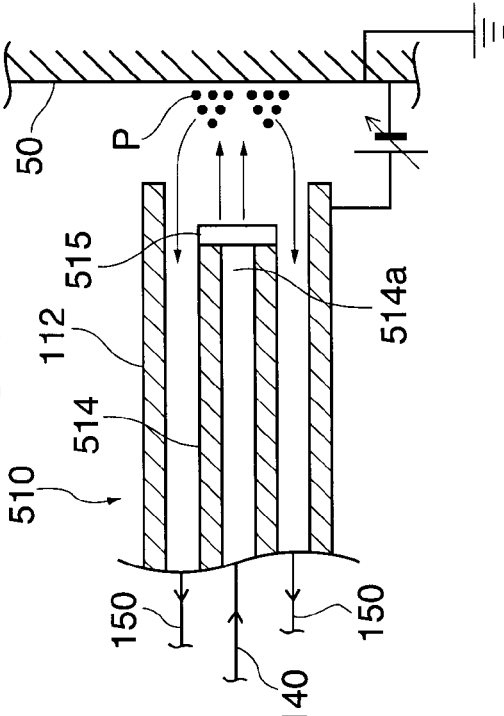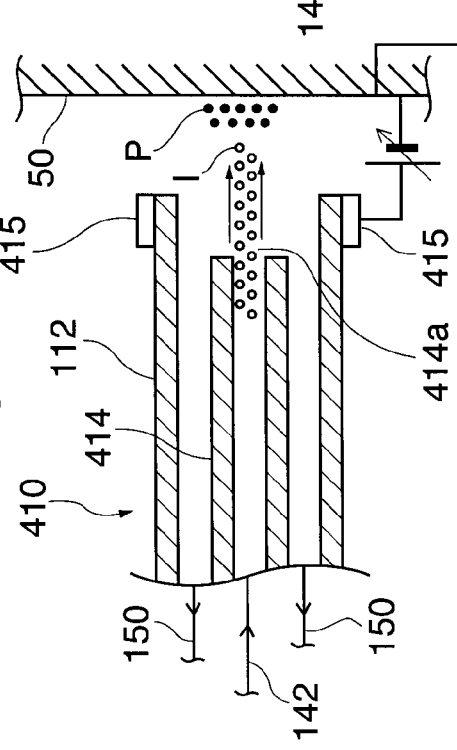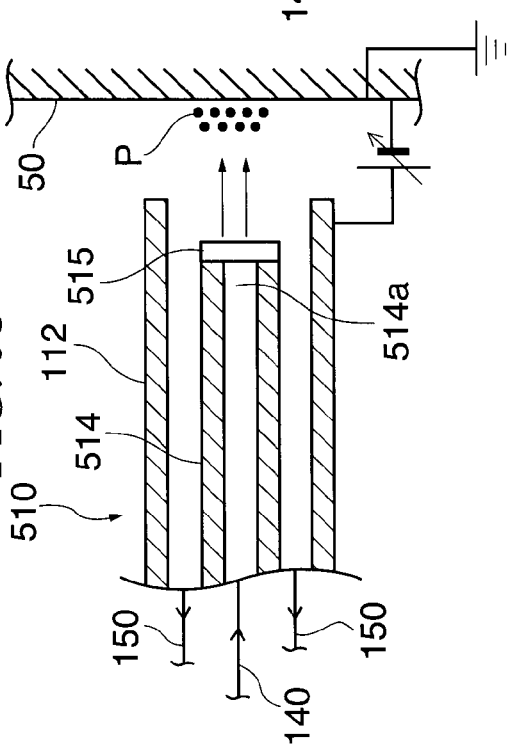

CLEANING APPARATUS AND CLEANING METHOD

BACKGROUND OF THE INVENTION

1. Field of the Invention

The present invention relates to a cleaning apparatus and a cleaning method, and more particularly to a cleaning apparatus and a cleaning method that clean narrow spaces in a semiconductor device manufacturing apparatus.

2. Description of the Related Art

In general, substrate processing apparatuses that subject substrates such as wafers for semiconductor devices to predetermined processing have a processing chamber (hereinafter referred to merely as "the chamber") in which predetermined processing is carried out on a substrate housed therein. Deposits arising from reaction products produced in the predetermined processing are attached to the interior of the chamber. When the deposits float to become particles, and the particles become attached to surfaces of substrates, a short circuit occurs in products such as semiconductor devices manufactured from the substrates, resulting in the yield of the semiconductor devices decreasing. Accordingly, to remove the deposits from the interior of the chamber, manual maintenance such as wet cleaning in the interior of the chamber has been conventionally performed by an operator.

However, since it is difficult for the operator to perform manual maintenance on component parts facing narrow spaces such as a bellows and an exhaust component in the chamber, deposits accumulate on the component parts facing the narrow spaces through the use of the substrate processing apparatus for a long time, and particles produced from the deposits enter into a substrate processing space and become attached to surfaces of substrates. For example, it is thought that deposits accumulated on a component part facing a narrow space in the vicinity of a manifold fall off the component part, particles produced from the accumulated deposits are caused to rebound by rotary blades of an exhaust pump provided in the vicinity of the manifold, and the rebounding particles enter into the substrate processing space and become attached to surfaces of substrates (see, for example, the specification of Japanese Patent Application No. 2006-005344).

Accordingly, to remove deposits accumulated on component parts facing narrow spaces such as a bellows and an exhaust component, suction has been conventionally carried out using a commercially available cleaner such as a cleaner having only a suction port.

However, in the case where deposits are removed by suction using the commercially available cleaner as mentioned above, it is difficult to remove fine deposits by suction, that is, it is difficult to satisfactorily clean component parts facing narrow spaces although relatively large deposits can be removed by suction. Thus, through the use of the substrate processing apparatus for a long time, the fine deposits accumulate on the component parts facing the narrow spaces, and particles produced from the accumulated deposits become attached to surfaces of substrates as mentioned above.

To cope with the above described problem, maintenance on component parts facing narrow spaces such as a bellows and an exhaust component is performed by replacing or disassembling them, but such maintenance requires a lot of time and effort and is very expensive.

SUMMARY OF THE INVENTION

The present invention provides a cleaning apparatus and a cleaning method that can efficiently and satisfactorily clean component parts facing narrow spaces.

Accordingly, in a first aspect of the present invention, there is provided a cleaning apparatus that removes deposits attached to a structural object to clean the structural object, comprising a jetting unit adapted to jet out a mixture of a substance in gaseous form and the same substance in liquid form or solid form as the former toward the deposits, and a suction unit adapted to suck the jetted mixture and the deposits to which the mixture has been jetted.

According to the first aspect of the present invention, since a mixture of a substance in gaseous form and the same substance in liquid form or solid form as the former is jetted out toward deposits attached to a structural object, the deposits to which the mixture has been jetted can be caused to fall off the structural object due to the viscosity, physical impact, entrainment, etc. of the mixture. Then, the jetted mixture and the deposits to which the mixture has been jetted are sucked, so that the deposits having fallen off the structural object can be sucked, and hence even fine deposits that would not be removed merely by suction can be removed. As a result, component parts facing narrow spaces in the substrate processing apparatus can be satisfactorily cleaned, and hence a decrease in the yield of semiconductor devices ultimately manufactured can be prevented.

The present invention can provide a cleaning apparatus, wherein a jet port of the jetting unit opens in a suction port of the suction unit.

According to the first aspect of the present invention, since the jet port of the jetting unit opens in the suction port of the suction unit, a mixture jetted out from the jet port and deposits to which the mixture has been jetted can be reliably sucked through the suction port, and also, the construction of the cleaning apparatus can be simplified.

The present invention can provide a cleaning apparatus, further comprising a pump to which the jetting unit and the suction unit are connected, and wherein the pump comprises a first impeller corresponding to the jetting unit and a second impeller corresponding to the suction unit, and the first impeller is disposed coaxially with the second impeller, and blades of the first impeller have inclinations opposite to inclinations of blades of the second impeller.

According to the first aspect of the present invention, in the pump to which the jetting unit and the suction unit are connected and has the first impeller corresponding to the jetting unit and the second impeller corresponding to the suction unit, the first impeller is disposed coaxially with the second impeller, and the blades of the first impeller have inclinations opposite to inclinations of the blades of the second impeller. As a result, it is possible to cause the jetting unit to jet out gas and cause the suction unit to suck gas at the same time, and in addition, the pump can be made compact.

The present invention can provide a cleaning apparatus, wherein the suction port of the suction unit is disposed in a vicinity of the jet port of the jetting unit.

According to the first aspect of the present invention, since the suction port of the suction unit is disposed in the vicinity of the jet port of the jetting unit, a mixture jetted out from the jet port and deposits to which the mixture has been jetted can be reliably sucked through the suction port. Further, since a high degree of flexibility in arranging the jetting unit and the suction unit is allowed, fine deposits attached to a structural object facing a narrower space can be efficiently and satisfactorily removed.

The present invention can provide a cleaning apparatus, wherein the jetting unit comprises a cylindrical member, and the jetting unit comprises a constricted portion in a vicinity of the jet port.

According to the first aspect of the present invention, since the jetting unit comprised of a cylindrical member has a constricted portion in the vicinity of the jet port, gas jetted out from the jetting unit can be accelerated in the vicinity of the jet port. As a result, a part of the gas can be turned into aerosols in the vicinity of the jet port, and also, a shock wave can be formed by the acceleration of the gas.

The present invention can provide a cleaning apparatus, wherein the jetting unit further comprises a heated gas jetting unit adapted to jet out a heated gas to the deposits, and the suction unit is adapted to suck the jetted heated gas and the deposits to which the heated gas has been jetted.

According to the first aspect of the present invention, since a heated gas is jetted to deposits attached to a structural object, the deposits to which the heated gas has been jetted can be caused to fall off the structural object by thermal stress due to the heated gas, or the like. Then, the jetted heated gas and the deposits to which the heated gas has been jetted are sucked, so that the deposits having falling off the structural object can be sucked, and hence fine deposits can be more efficiently removed.

The present invention can provide a cleaning apparatus, wherein the jetting unit further comprises a vibration-applied gas jetting unit adapted to apply a vibration to a gas and jet out the gas to the deposits, and the suction unit is adapted to suck the jetted vibration-applied gas and the deposits to which the vibration-applied gas has been jetted.

According to the first aspect of the present invention, since a gas to which a vibration (such as a pulse) is applied is jetted to deposits attached to a structural object, the deposits to which the vibration-applied gas has been jetted can be caused to fall off the structural object by a strong physical impact due to collision with molecules or the like in the vibration-applied gas. Then, the jetted vibration-applied gas and the deposits to which the vibration-applied gas has been jetted are sucked, so that the deposits having fallen off the structural object can be sucked, and hence fine deposits can be more efficiently removed.

The present invention can provide a cleaning apparatus, wherein the jetting unit further comprises a unipolar ion jetting unit that jets out unipolar ions to the deposits, and the suction unit further comprises a reverse electric field generator adapted to generate an electric field of a reverse polarity to a polarity of the unipolar ions in the suction part and sucks the jetted unipolar ions and the deposits to which the unipolar ions have been jetted.

According to the first aspect of the present invention, since unipolar ions are jetted to deposits attached to a structural object, the deposits to which the unipolar ions have been jetted can be charged on a single pole by the unipolar ions. Then, an electric field of a reverse polarity to the polarity of the unipolar ions is generated in the suction port, and the jetted unipolar ions and the deposits to which the unipolar ions have been jetted are sucked, so that the deposits charged on the single pole can be caused to fall off the structural object by an attractive force, and the deposits having fallen off the structural object can be sucked, and hence fine deposits can be more efficiently removed.

The present invention can provide a cleaning apparatus, wherein the jetting unit further comprises a plasma jetting unit that jets out plasma to the deposits, and the suction unit is adapted to suck the jetted plasma and the deposits to which the plasma has been jetted.

According to the first aspect of the present invention, since plasma is jetted to deposits attached to a structural object, the deposits to which the plasma has been jetted can be caused to fall off the structural object by a chemical reaction with radicals in the plasma. Then, the jetted plasma and the deposits to which the plasma has been jetted are sucked, so that the deposits having fallen off the structural object can be sucked, and hence fine deposits can be more efficiently removed.

The present invention can provide a cleaning apparatus, wherein the jetting unit further comprises a brush unit adapted to scrub away the deposits, and the suction unit is adapted to suck the deposits scrubbed away by the brush unit.

According to the first aspect of the present invention, since deposits attached to a structural object are scrubbed away, the deposits can be caused to fall off the structural object. Then, the deposits thus scrubbed away are sucked, so that the deposits having fallen off the structural object can be sucked, and hence the deposits can be reliably removed.

The present invention can provide a cleaning apparatus, wherein the jetting unit further comprises a sterilizing unit adapted to sterilize the structural object.

According to the first aspect of the present invention, since a structural object is sterilized, the emission of contaminants caused by the growth of bacteria in the substrate processing apparatus can be prevented.

Accordingly, in a second aspect of the present invention, there is provided a cleaning method of removing deposits attached to a structural object to clean the structural object, comprising a jetting step of jetting out a mixture of a substance in gaseous form and the same substance in liquid form or solid form as the former toward the deposits, and a suction step of sucking the jetted mixture and the deposits to which the mixture has been jetted.

According to the second aspect of the present invention, since a mixture of a substance in gaseous form and the same substance in liquid form or solid form as the former is jetted out toward deposits attached to a structural object, the deposits to which the mixture has been jetted can be caused to fall off the structural object due to the viscosity, physical impact, entrainment, etc. of the mixture. Then, the jetted mixture and the deposits to which the mixture has been jetted are sucked, so that the deposits having fallen off the structural object can be sucked, and hence even fine deposits that would not be removed merely by suction can be removed. As a result, component parts facing narrow spaces in the substrate processing apparatus can be satisfactorily cleaned, and hence a decrease in the yield of semiconductor devices ultimately manufactured can be prevented.

The above and other objects, features, and advantages of the invention will become more apparent from the following detailed description taken in conjunction with the accompanying drawings.

BRIEF DESCRIPTION OF THE DRAWINGS

FIGS. 5A and 5B are process drawings showing a cleaning process using a first variation of the cleaning apparatus according to the embodiment;

FIGS. 5C and 5D are process drawings showing a cleaning process using a second variation of the cleaning apparatus according to the embodiment;

FIGS. 6A and 6B are process drawings showing a cleaning process using a third variation of the cleaning apparatus according to the embodiment;

FIGS. 6C and 6D are process drawings showing a cleaning process using a fourth variation of the cleaning apparatus according to the embodiment;

DETAILED DESCRIPTION OF THE PREFERRED EMBODIMENTS

The present invention will now be described in detail below with reference to the drawings showing a preferred embodiment thereof.

First, a description will be given of a substrate processing apparatus to which a cleaning apparatus according to an embodiment of the present invention is applied.

Figure 1:
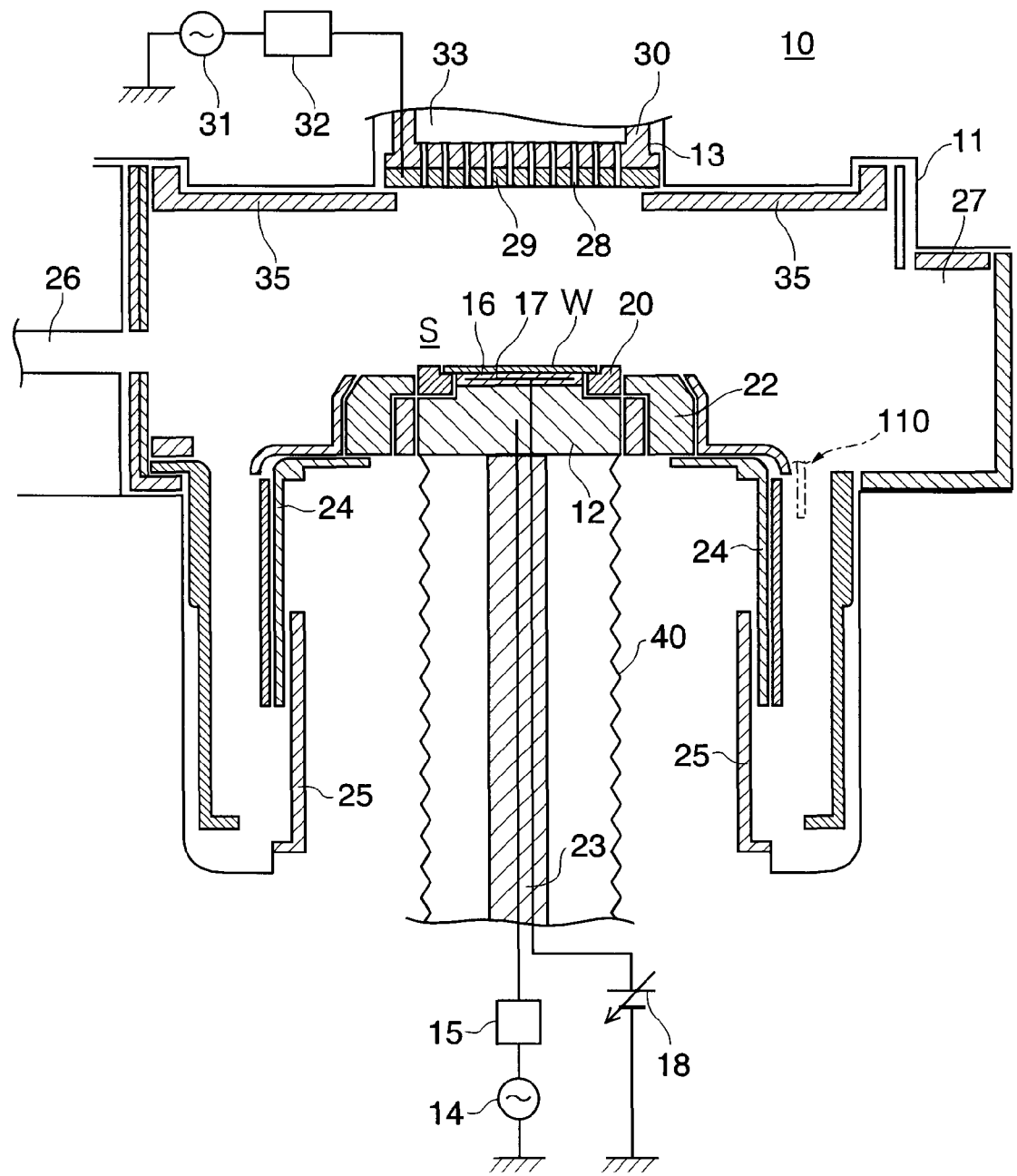
FIG. 1 is a sectional view schematically showing the construction of a substrate processing apparatus to which a cleaning apparatus according to an embodiment of the present invention is applied.

FIG. 1 is a sectional view schematically showing the construction of the substrate processing apparatus to which the cleaning apparatus according to the embodiment is applied.

As shown in FIG. 1, the substrate processing apparatus 10 implemented by an etching processing apparatus that subjects wafers W for semiconductor devices (hereinafter referred to merely as "wafers W") to plasma processing such as reactive ion etching has a chamber 11 as a processing chamber made of a metallic material such as aluminum or stainless steel.

The chamber 11 has disposed therein a lower electrode 12 as a stage on which is mounted a wafer W having a diameter of, for example, 300 mm and which moves up and down in conjunction with the mounted wafer W in the chamber 11, and a shower head 13 that is disposed in a ceiling portion of the chamber 12 and in opposed relation to the lower electrode 12 and supplies a processing gas, described later, into the chamber 11.

A lower radio frequency power source 14 is connected to the lower electrode 12 via a lower matcher 15, and the lower radio frequency power source 14 supplies radio frequency electrical power of a predetermined frequency to the lower electrode 12. The lower matcher 15 reduces reflection of the radio frequency electrical power from the lower electrode 12 so as to maximize the efficiency of the supply of the radio frequency electrical power into the lower electrode 12.

An ESC 16 for attracting a wafer W with an electrostatic attracting force is disposed in an upper part of the interior of the lower electrode 12. The ESC 16 has therein an ESC electrode plate 17 comprised of laminated electrode films, and a direct-current power source 18 is electrically connected to the ESC electrode plate 17. A wafer W is attracted to and held on an upper surface of the ESC 16 through a Coulomb force or a Johnsen-Rahbek force generated by a direct-current voltage applied from the direct-current power source 18 to the ESC electrode plate 17. An annular focus ring 20 made of silicon (Si) or the like is disposed around an outer periphery of the ESC 16, and the focus ring 20 focuses plasma produced above the lower electrode 12 toward the wafer W.

Under the lower electrode 12, a support 23 is disposed extending downward from the bottom of the lower electrode 12. The support 23 supports the lower electrode 12 and moves the lower electrode 12 up and down through rotational motion of a ball screw, not shown. Also, the support 23 is covered by a bellows 40 and shut off from an atmosphere in the chamber 11. The bellows 40 (structural object) is covered by bellows covers 24 and 25, so that a very narrow space is formed in the vicinity of the bellows 40.

A transfer port 26 for wafers W and an exhaust portion 27 (structural object) are provided in a side wall of the chamber 11. The wafers W are transferred into and out from the chamber 11 via the transfer port 26 by a transfer arm, not shown, provided in an LLM (load lock module), not shown, disposed adjacent to the substrate processing apparatus 10. The exhaust portion 27 is connected to an exhaust system that is comprised of an exhaust manifold, an APC (automatic pressure control) valve, a DP (dry pump), a TMP (turbo-molecular pump), and so on, all of which are not shown, and exhausts air or the like from the chamber 11 to the outside. A very narrow space is formed in the vicinity of the exhaust portion 27 as well.

In the substrate processing apparatus 10, when a wafer W is to be transferred into the chamber 11, the lower electrode 12 moves down so as to be level with the transfer port 26, and when plasma processing is to be carried out on the wafer W, the lower electrode 12 moves up to a processing position for the wafer W. It should be noted that FIG. 1 shows the positional relationship between the transfer port 26 and the lower electrode 12 in the case where the wafer W is transferred into the chamber 11.

The shower head 13 is comprised of a disk-shaped upper electrode (CEL) 29 that faces a processing space S above the lower electrode 12 and has a large number of gas vent holes 28 therein, and an electrode support 30 that is disposed on top of the upper electrode 29 and detachably supports the upper electrode 29. An outer peripheral portion of a surface of the upper electrode 29 facing the processing space S is covered by an inner peripheral portion of a shield ring 35 that is an annular member disposed in a ceiling portion of the chamber 11. The shield ring 35 is made of, for example, quartz and protects a screw, not shown, that is disposed at an outer peripheral edge of the upper electrode 29 and fastens the upper electrode 29 onto the ceiling of the chamber 11, from plasma.

An upper radio frequency power source 31 is connected to the upper electrode 29 via an upper matcher 32. The upper radio frequency power source 31 supplies radio frequency electrical power of a predetermined frequency to the upper electrode 29. The upper matcher 32 reduces reflection of the radio frequency electrical power from the upper electrode 29 so as to maximize the efficiency of the supply of the radio frequency electrical power into the upper electrode 29.

A buffer chamber 33 is provided inside the electrode supporting member 30, and a processing gas introducing pipe, not shown, is connected to the buffer chamber 33. A processing gas comprised of an oxygen gas ($O_2$), an argon gas (Ar), or a carbon tetrafluoride singly or in combination is introduced to the buffer chamber 33 via the processing gas introducing pipe, and then the introduced processing gas is supplied into the processing space S via the gas bent holes 28.

In the chamber 11 of the substrate processing apparatus 10, radio frequency electrical power is applied to the lower electrode 12 and the upper electrode 29 as described above, whereby the processing gas supplied into the processing space S is turned into high-density plasma such as ions and radicals by the applied radio frequency electrical power, so that plasma comprised of ions, radicals, and so on is produced. The plasma thus produced is focused onto a surface of the wafer W by the focus ring 19, whereby the surface of the wafer W is physically/chemically etched.

Also, in the chamber 11 of the substrate processing apparatus 10, reaction products are produced during the etching and become attached to component parts in the chamber 11, such as the bellows 40 and the exhaust portion 27.

Next, a description will be given of the cleaning apparatus according to the present embodiment. The cleaning apparatus according to the present embodiment is applied particularly to cleaning of component parts facing narrow spaces in the substrate processing apparatus described above.

Figure 2A:
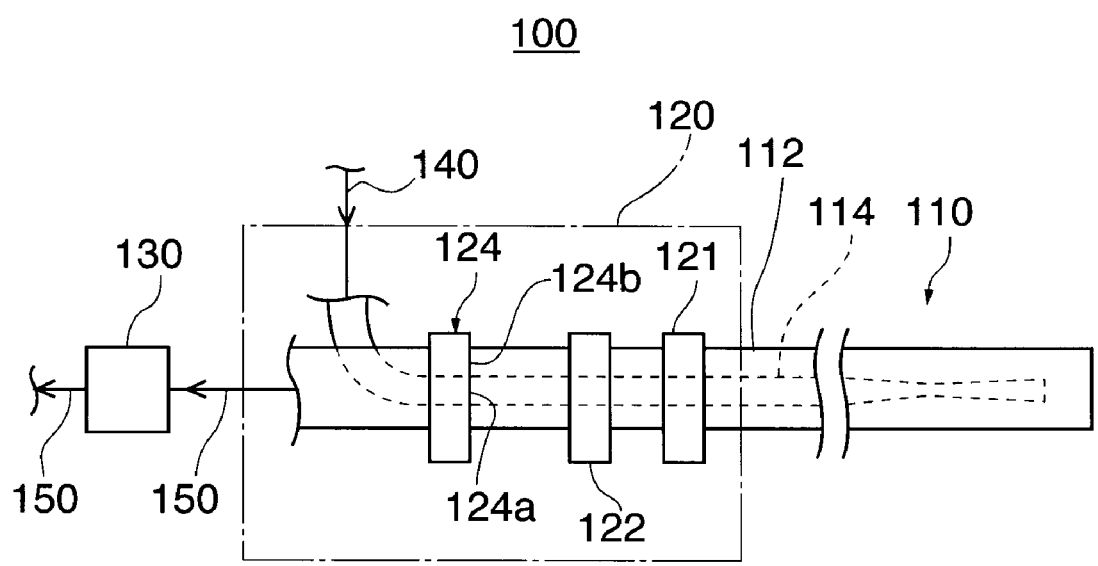
FIG. 2A is a diagram schematically showing the construction of the cleaning apparatus according to the embodiment.
Figure 2B:
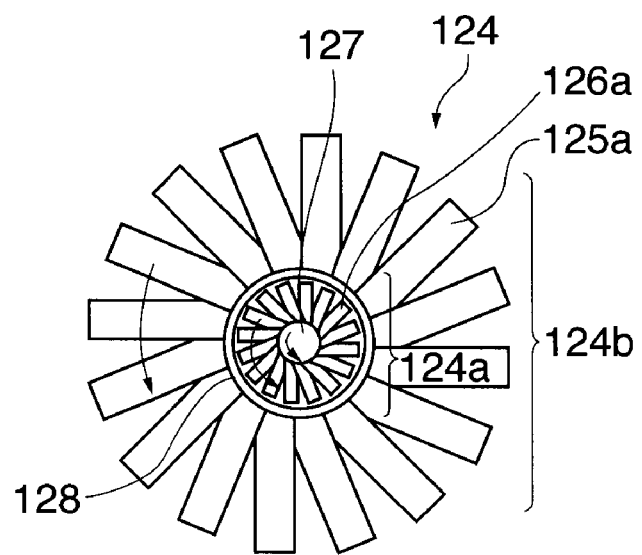
FIG. 2B is a view schematically showing the construction of an impeller of a pump appearing in FIG. 2A.

FIG. 2A is a diagram schematically showing the construction of the cleaning apparatus according to the present embodiment. It should be noted that the right-hand side of FIG. 2A is referred to as "the right side", and the left-hand side of FIG. 2A is referred to as "the left side". FIG. 2B is a view schematically showing the construction of an impeller of a pump appearing in FIG. 2A.

As shown in FIG. 2A, the cleaning apparatus 100 is comprised of a main body 120 enclosed by a housing, not shown; a double-pipe nozzle 110 that is comprised of a suction pipe 112 and a jet pipe 114, described later, that penetrate through the housing from inside the main body 120 and extends rightward in such a manner as to freely bend; a gas supply pipe 140 that is connected to the jet pipe 114 inside the main body 120 and supplies a predetermined gas supplied from a gas supply unit, not shown, into the jet pipe 114; a gas exhaust pipe 150 that is connected to the suction pipe 112 inside the main body 120 and exhausts a suction gas in the suction pipe 112 to the outside; and a harmful matter removal unit 130 that is disposed part way along the gas exhaust pipe 150 and outside the main body 12.

In the main body 120, a pump 124 shown in FIG. 2B, a particle removal filter 122, and a particle monitor 121 are interposed in this order from the left in the double-pipe nozzle 110. The double pipe nozzle 110 is constructed such that the jet pipe 114 penetrates through a side face of the suction pipe 112 at the left side with respect to the pump 124 and branches off from the suction pipe 112, and from this point, the jet pipe 114 and the suction pipe 112 function as pipes independent of each other.

As shown in FIG. 2B, the pump 124 has a central shaft 127 at the center thereof, and the central shaft 127 is rotated counterclockwise as viewed in FIG. 2B by a torque from a motor, not shown, connected to the central shaft 127. A plurality of blades 126a radially extending outward from the central shaft 127 are disposed at regular intervals around the periphery of the central shaft 127. The central shaft 127 and the plurality of blades 126a constitute a jet impeller 124a, which is interposed in the jet pipe 114 of the double-pipe nozzle 110. The blades 126a are provided with inclinations so as to flow gas in the jet port 114 from the left side to the right side as viewed in FIG. 2A through counterclockwise rotation.

Further, the pump 124 has an annular shaft 128 that is joined to outer ends of the respective blades 126a in the radial direction thereof and is disposed to enclose the blades 126a. A plurality of blades 125a radially extending outward from the annular shaft 128 are disposed at regular intervals around the periphery of the annular shaft 128. The annular shaft 128 and the plurality of blades 125a constitute a suction impeller 124b, which is interposed in the suction pipe 112 of the double-pipe nozzle 110. The blades 125a are provided with reverse inclinations to the inclinations of the blades 126a so as to flow gas in the suction pipe 112 from the right side to the left side as viewed in FIG. 2A through counterclockwise rotation.

With this arrangement, the pump 124 can cause the jet pipe 114 to jet out gas and cause the suction pipe 112 to draw in gas by suction at the same time. Moreover, since the suction impeller 124b and the jet impeller 124a are coaxially provided in the pump 124, the pump 124 can be made compact.

Further, in the present embodiment, the annular shaft 128 may be connected to a motor, not shown, other than the motor connected to the central shaft 127 without being joined to the inside blades 126a, and the inside blades 126a and the outer blades 125a may be arbitrarily rotated by adjusting torques from the respective motors. Therefore, the level of jet force with which gas is jetted out from the jet pipe 114 and the level of suction force with which the suction pipe 112 draws in gas can be arbitrarily adjusted.

The particle removal filter 122 removes particles in the sucked gas in the suction pipe 112. The particle monitor 121 monitors the amount of particles in the sucked gas in the suction pipe 112 using a laser light scattering method. By monitoring the amount of particles in the sucked gas, an end point of a cleaning process, described later, can be detected. The harmful matter removal unit 130 has therein an activated carbon or the like and adsorbs organic matter and harmful matter included in the sucked gas using the activated carbon.

Figure 3A:
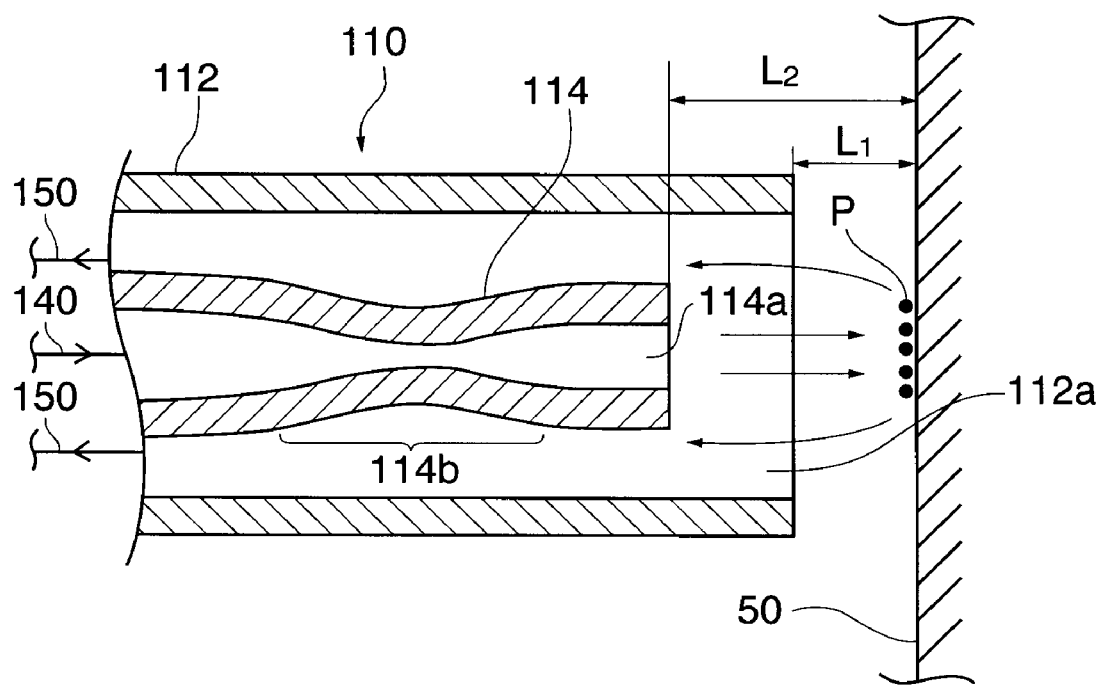
FIG. 3A is an enlarged sectional view schematically showing the construction of an end portion of a double-pipe nozzle appearing in FIG. 2A.
Figure 3B:
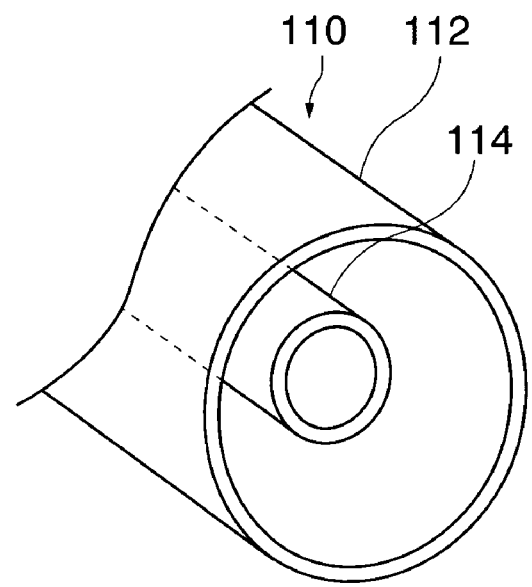
FIG. 3B is a perspective view schematically showing the constructions of a jet port and a suction port of the double-pipe nozzle.

FIG. 3A is an enlarged sectional view schematically showing the construction of an end portion of the double-pipe nozzle 110 appearing in FIG. 2A, and FIG. 3B is a perspective view schematically showing the constructions of the end portion of the double-pipe nozzle 110. FIG. 3A is useful in explaining a case where particles P attached to a surface of a structural object 50 is cleaned using the double-pipe nozzle 110. It should be noted that although structural objects facing narrow spaces include the bellows 40 and the exhaust portion 27, but in the following description, the generalized structural object 50 is used for the convenience of explanation.

As shown in FIG. 3A, the double-pipe nozzle 110 has the jet pipe 114 and the suction pipe 112 that encloses the jet pipe 114, and a jet port 114a of the jet pipe 114 opens in a suction port 112a of the suction pipe 112. The jet pipe 114 has a constricted portion 114b in the vicinity of the jet port 114a, and a predetermined gas supplied by the gas supply pipe 140 and accelerated to a predetermined flow rate by the pump 124 is further accelerated in the constricted portion 114b. As a result, the pressure of the gas in the constricted portion 114b of the jet pipe 114 rapidly decreases, and a part of the gas coagulates into aerosols due to adiabatic expansion of the gas. Also, the accelerated gas forms a shock wave. Thus, the jet pipe 114 jets out the gas and the shock wave including the aerosols comprised of the same substance as the gas toward the particles P attached to the surface of the structural object 50.

In the present embodiment, in order to cause the jet pipe 114 to jet out a gas including aerosols, the above-mentioned gas supply unit, not shown, supplies a gas containing components that readily turn into aerosols. Also, since the cleaning apparatus 100 according to the present embodiment is used under atmospheric pressure and at room temperature, it is preferred that the gas jet out from the jet pipe 114 is a gas that is held in gaseous form or liquid form under atmospheric pressure and at room temperature and has high sublimation capability and high volatility since there is only a small difference between the fusing point and boiling point of the gas. Examples of the gas supplied from the gas supply unit into the jet pipe 114 include nitrogen, argon, carbon dioxide, water, and ethanol.

Through numeric simulations and the like, the inventors of the present invention has found that in an environment outside of which there is no motion, the speed of the gas jet out from the jet pipe 114 reaches its peak within a range of approximately 20 mm from the jet port 114a, and thus, the distance $L_2$ from the jet port 114a to the structural object 50 is preferably set to be not more than 20 mm. Further, since there may be cases where the gas jet out from the jet pipe 114 contains harmful matter, the distance $L_1$ from the suction port 112a to the structural object 50 is preferably set to be not more than 10 mm to decrease emission of the gas containing harmful matter toward the external atmosphere. Thus, the end portion of the double-pipe nozzle 110 is preferably shaped such that the suction port 112a of the suction pipe 112 projects out approximately 10 mm from the jet port 114a of the jet pipe 114.

A description will now be given of a cleaning process using the cleaning apparatus according to the present embodiment.

Figure 4A:
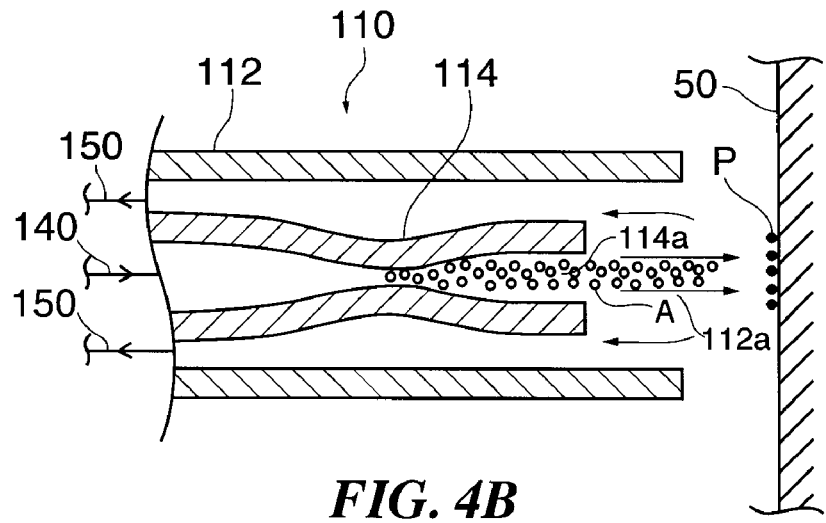
FIGS. 4A to 4C are process drawings showing a cleaning process using the cleaning apparatus according to the embodiment.
Figure 4B:
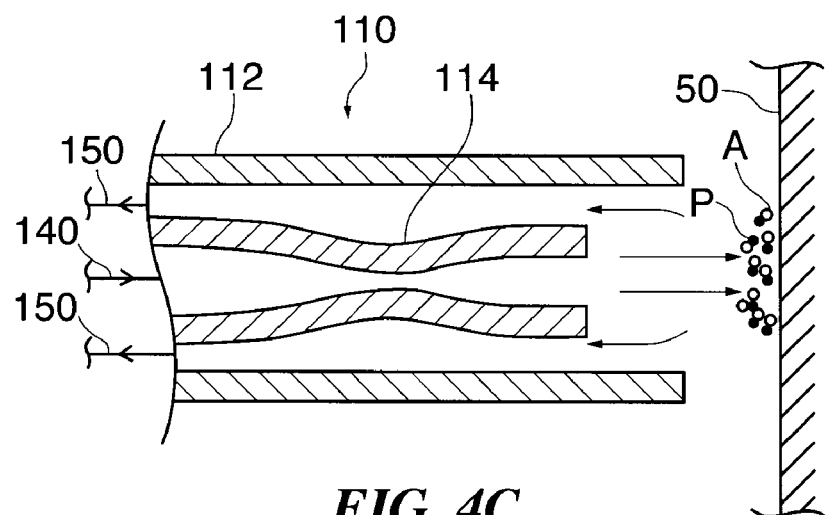
Figure 4C:
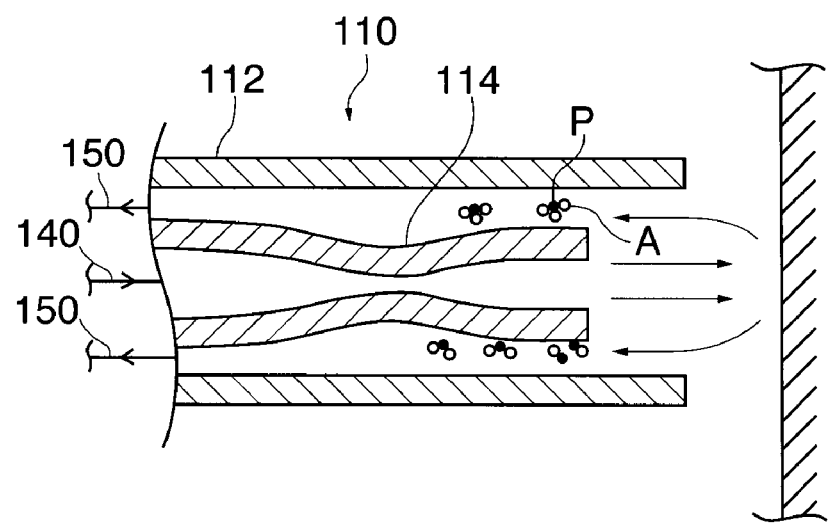

FIGS. 4A to 4C are process drawings showing the cleaning process using the cleaning apparatus according to the present embodiment.

As shown in FIGS. 4A to 4C, first, a gas and a shock wave including aerosols A comprised of the same substance as the gas are jetted out from the jet port 114a of the jet pipe 114 in the double-pipe nozzle 110 toward particles P attached to the surface of the structural object 50 (FIG. 4A).

Next, the particles P attached to the surface of the structural object 50 are caused to fall off the surface of the structural object 50 due to the viscosity of the gas, the physical impact of the gas, the physical impact of the aerosols A, the entrainment of the aerosols A, and so on (FIG. 4B).

Then, the particles P caused to fall off the surface of the structural object 50 are sucked by the suction pipe 112 through the suction port 112a and discharged to the outside (FIG. 4C).

According to the cleaning process in FIGS. 4A to 4C, since a gas and a shock wave including aerosols A comprised of the same substance of the gas are jetted out from the jet port 114a to particles P attached to the surface of the structural object 50, and the particles P are caused to fall off due to the viscosity of the gas and the like and sucked through the suction port 112a, fine particles P (deposits) that would not be removed merely by suction can be removed. As a result, component parts facing narrow spaces in the substrate processing apparatus 10 can be satisfactorily cleaned, and hence a decrease in the yield of semiconductor devices ultimately manufactured can be prevented.

Further, since aerosols comprised of the same substance as a gas are generated, another substance that readily coagulates does not have to be mixed in the gas, and hence the gas can be easily treated, and also, the construction of the gas supply unit can be simplified.

Next, a description will now be given of cleaning processes using variations of the cleaning apparatus according to the present embodiment. In the variations of the cleaning apparatus, constructions described below are preferably added to the above described construction that the jet pipe 114 is provided inside the suction pipe 112.

FIGS. 5A and 5B are process drawings showing a cleaning process using a first variation of the cleaning apparatus according to the present embodiment.

First, a heated gas heated by a heating unit 141 disposed part way along a gas supply pipe 140 is jetted out from a jet port 214a of a heated gas jet pipe 214 in a nozzle 210 toward particles P attached to the surface of the structural object 50 (FIG. 5A).

Next, the particles P to which the heated gas has been jetted are caused to fall off the surface of the structural object 50 using thermal stress due to the gas and sucked into the suction pipe 112 through the suction port 112a and discharged to the outside (FIG. 5B).

According to the cleaning process in FIGS. 5A and 5B, since a heated gas is jetted out from the jet port 214a to particles P, and the particles P are caused to fall off using thermal stress due to the gas and sucked through the suction port 112a, the fine particles P can be more efficiently removed.

FIGS. 5C and 5D are process drawings showing a cleaning process using a second variation of the cleaning apparatus according to the present embodiment.

First, a vibration is applied to a gas by an ultrasonic generator 315 disposed in a jet port 314a of a vibration-applied gas jet pipe 314 in a nozzle 310, and the vibration-applied gas is jetted out from the jet port 314a of the vibration-applied gas jet pipe 314 to particles P attached to the surface of the structural object 50 (FIG. 5C).

Next, the particles P to which the vibration-applied gas has been jetted are caused to fall off the surface of the structural object 50 by a strong physical impact due to collision with molecules or the like in the vibration-applied gas caused by the application of the vibration to the gas and sucked into the suction pipe 112 through the suction port 112a and discharged to the outside (FIG. 5D).

According to the cleaning process in FIGS. 5C and 5D, since a vibration-applied gas is jetted out from the jet port 314a to particles P, and the particles P are caused to fall off through a strong physical impact due to collision with molecules or the like and sucked through the suction port 112a, the fine particles P can be more efficiently removed.

FIGS. 6A and 6B are process drawings showing a cleaning process using a third variation of the cleaning apparatus according to the present embodiment.

First, unipolar ions I supplied from a unipolar ion supply pipe 142 are jetted out from a jet port 414a of a unipolar ion jet pipe 414 in a nozzle 410 to particles P attached to the surface of the structural object 50 (FIG. 6A).

Next, the particles P to which the unipolar ions I has been jetted are charged on a single pole by the unipolar ions I and caused to fall off the surface of the structural object 50 by an attractive force from an electric field of the reverse polarity to the polarity of the unipolar ions I generated by an electrode plate 415 (opposite electric field generator) provided in the vicinity of the suction port 112a of the suction pipe 112 and sucked into the suction pipe 112 through the suction port 112a and discharged to the outside (FIG. 6B).

According to the cleaning process in FIGS. 6A and 6B, since unipolar ions I are jetted out from the jet port 414a to particles P so as to charge the particles P by the unipolar ions I, and the particles P are caused to fall off by an attractive force from an electric field of the reverse polarity to the polarity of the unipolar ions I and sucked through the suction port 112a, the fine particles P can be more efficiently removed.

Although in the present process, it may be considered that particles P become attached to the electrode plate 415 provided in the vicinity of the suction port 112a of the suction pipe 112 to reduce the attractive force of the electrode plate 415, but the attachment of the particles P to the electrode plate 415 can be prevented by connecting an oscillator, a heater, or the like to the electrode plate 415.

FIGS. 6C and 6D are process drawings showing a cleaning process using a fourth variation of the cleaning apparatus according to the present embodiment.

First, plasma is generated from a jet port 514a of a radical jet pipe 514 in a nozzle 510 via an atmospheric plasma generator 515, and the plasma, in particular, radicals in the plasma are jetted out toward particles P attached to the surface of the structural object 50 (FIG. 6C).

Next, the particles P to which the radicals has been jetted are caused to fall off the surface of the structural object 50 through chemical reaction with the radicals and sucked into the suction pipe 112 through the suction port 112a and discharged to the outside (FIG. 6D).

According to the cleaning process in FIGS. 6C and 6D, since plasma is generated from the jet port 514a via the atmospheric plasma generator 515, radicals in the plasma are jetted out to the particles P, and the particles P are caused to fall off by a chemical reaction with the radicals and sucked through the suction port 112a, the fine particles P can be more efficiently removed.

Figure 7A:
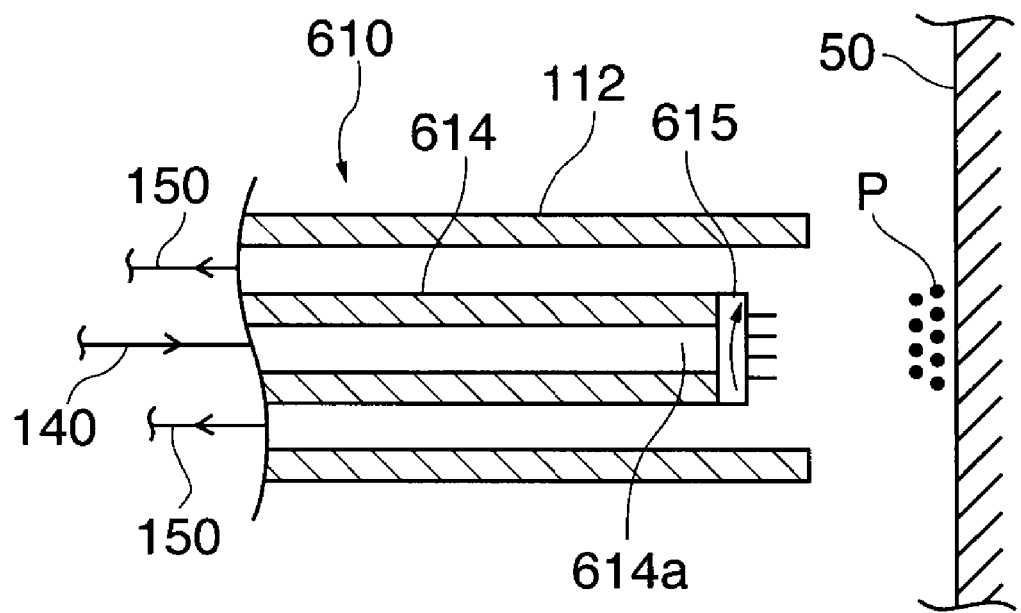
FIG. 7A is an enlarged sectional view schematically showing the construction of the essential parts of a fifth variation of the cleaning apparatus according to the embodiment.

FIG. 7A is an enlarged sectional view schematically showing the construction of the essential parts of a fifth variation of the cleaning apparatus according to the present embodiment.

As shown in FIG. 7A, a nozzle 610 has a jet pipe 614, and the suction pipe 112 that encloses the jet pipe 614. The jet pipe 614 has a rotary brush 615 in a jet port 614a and presses the rotary brush 615 against particles P attached to the structural object 50 while rotating the rotary brush 615 and jets out a gas toward the particles P. Since the gas can be jetted out while the particles P are scrubbed away, the particles P can be reliably caused to fall off, and hence the particles P can be reliably removed.

Figure 7B:
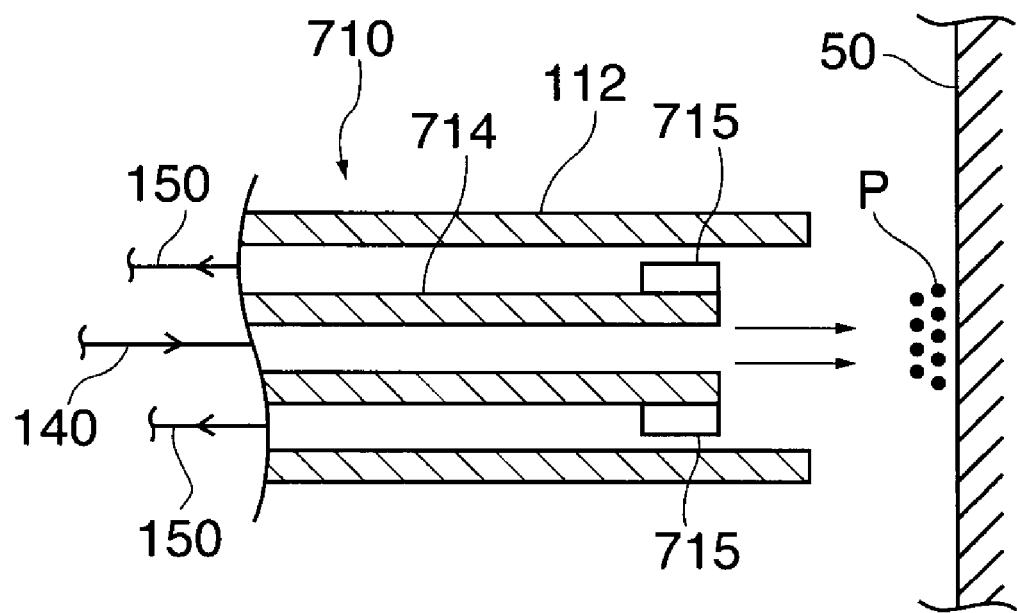
FIG. 7B is an enlarged sectional view schematically showing the construction of the essential parts of a sixth variation of the cleaning apparatus according to the embodiment.

FIG. 7B is an enlarged sectional view schematically showing the construction of the essential parts of a sixth variation of the cleaning apparatus according to the present embodiment.

As shown in FIG. 7B, a nozzle 710 has a jet pipe 714, and the suction pipe 112 that encloses the jet pipe 714. The jet pipe 714 has a low-pressure mercury vapor lamp 715 in the vicinity of a jet port 714a and irradiates an ultraviolet ray having a wavelength of 254 nm from the low-pressure mercury vapor lamp 715 onto a structural object 50 and jets out a gas toward particles P. Therefore, the particles P can be removed, and the structural object 50 can be sterilized, and hence the emission of contaminants caused by the growth of bacteria attached to the structural object 50 can also be prevented.

Figure 8A:
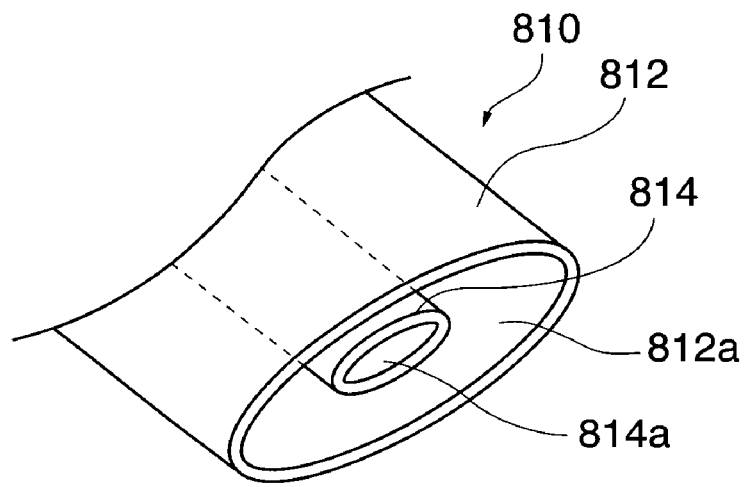
FIG. 8A is a perspective view schematically showing the construction of the essential parts of a seventh variation of the cleaning apparatus according to the embodiment.

FIG. 8A is a perspective view schematically showing the construction of the essential parts of a seventh variation of the cleaning apparatus according to the present embodiment.

As shown in FIG. 8A, a double-pipe nozzle 810 has a jet pipe 814 that has a flat shape, and a suction pipe 812 that has a flat shape similarly to the jet pipe 814 and encloses the jet pipe 814. A jet port 814a of the jet pipe 814 opens in a suction port 812a of the suction pipe 812. Therefore, fine particles P can be removed by carrying out any of the cleaning processes described above. Also, since the double-pipe nozzle 810 is comprised of the jet pipe 814 and the suction pipe 812 that have a flat shape, which is suitable for scrubbing, a structural object can be cleaned by scrubbing with the tip of the double-pipe nozzle 810.

Figure 8B:
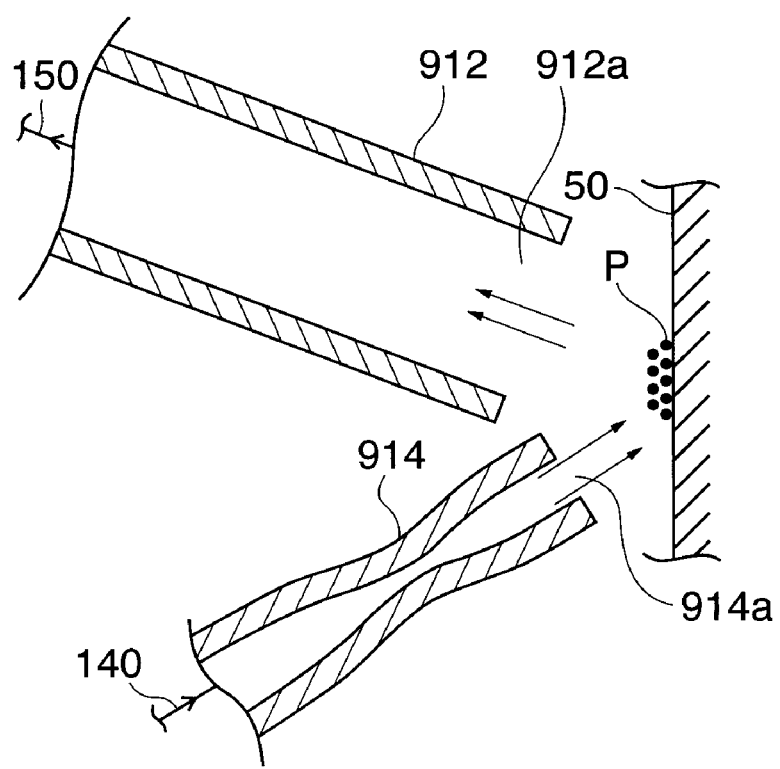
FIG. 8B is an enlarged sectional view schematically showing the construction of the essential parts of an eighth variation of the cleaning apparatus according to the embodiment.

FIG. 8B is an enlarged sectional view schematically showing the construction of the essential parts of an eighth variation of the cleaning apparatus according to the present embodiment.

As shown in FIG. 8B, it may be configured such that a jet pipe 914 and a suction pipe 912 do not constitute a double-pipe structure, but instead, a suction port 912a of the suction pipe 912 is disposed in the vicinity of the jet port 914a of the jet pipe 914. In the present variation as well, fine particles P can be removed by carrying out any of the cleaning processes described above. Also, in the present variation, since a high degree of flexibility in arranging the jet pipe 914 and the suction pipe 912 is allowed, fine particles P attached to a structural object facing a narrower space can be efficiently and satisfactorily removed.

Although in the above described embodiment, it is assumed that the substrate processing apparatus to which the present invention is applied is the etching processing apparatus as the semiconductor device manufacturing apparatus, the substrate processing apparatus to which the present invention may be applied is not limited to this, but the present invention may be applied to semiconductor device manufacturing apparatuses such as deposition apparatuses using a CVD (Chemical Vapor Deposition) method, a PVD (Physical Vapor Deposition) method, and so on. Further, the present invention may be applied to any substrate processing apparatuses such as an ion plantation apparatus, a vacuum transfer apparatus, a heat processing apparatus, an analyzer, an electron accelerator, a FPD (Flat Panel Display) manufacturing apparatus, a solar cell manufacturing apparatus, an etching apparatus as a physical quantity analyzer, and a deposition apparatus insofar as they have a narrow space therein.

Further, the present invention should not necessarily be applied to substrate processing apparatuses, but may be applied to, for example, cleaning apparatuses for medical appliances.

What is claimed is:

1. A cleaning apparatus that removes deposits attached to a structural object to clean the structural object, comprising:
    a jetting unit adapted to jet out a mixture of a substance in gaseous form and the same substance in liquid form or solid form as the former toward the deposits;
    a suction unit adapted to suck the jetted mixture and the deposits to which the mixture has been jetted; and
    a pump to which said jetting unit and said suction unit are connected,
    wherein
    a jet port of said jetting unit is surrounded by a suction port of said suction unit and opens in the suction port,
    said pump comprises a first impeller corresponding to said jetting unit and a second impeller corresponding to said suction unit, and
    said first impeller is disposed coaxially with said second impeller, and blades of said first impeller have inclinations opposite to inclinations of blades of said second impeller.

2. A cleaning apparatus as claimed in claim 1, wherein
    said jetting unit further comprises a unipolar ion jetting unit that jets out unipolar ions to the deposits, and
    said suction unit further comprises a reverse electric field generator adapted to generate an electric field of a reverse polarity to a polarity of the unipolar ions in a suction part thereof and sucks the jetted unipolar ions and the deposits to which the unipolar ions have been jetted.

3. A cleaning apparatus as claimed in claim 1, wherein
    said jetting unit further comprises a plasma jetting unit that jets out plasma to the deposits, and
    said suction unit is adapted to suck the jetted plasma and the deposits to which the plasma has been jetted.

4. A cleaning apparatus as claimed in claim 1, wherein
    said jetting unit further comprises a brush unit adapted to scrub away the deposits, and said suction unit is adapted to suck the deposits scrubbed away by said brush unit.

5. A cleaning apparatus as claimed in claim 1, wherein said jetting unit further comprises a sterilizing unit adapted to sterilize the structural object.

6. A cleaning apparatus that removes deposits attached to a structural object to clean the structural object, comprising:
   a pipe-shaped jetting unit adapted to jet out a mixture of a substance in gaseous form and the same substance in liquid form or solid form as the former toward the deposits; and
   a pipe-shaped suction unit adapted to suck the jetted mixture and the deposits to which the mixture has been jetted,
   wherein
      said pipe-shaped jetting unit further comprises a heated gas jetting unit adapted to jet out a heated gas to the deposits,
      said pipe-shaped suction unit is adapted to suck the jetted heated gas and the deposits to which the heated gas has been jetted,
      said pipe-shaped suction unit coaxially accommodates said pipe-shaped jetting unit therein so that a jet port of said pipe-shaped jetting unit is surrounded by a suction port of said pipe-shaped suction unit and opens in the suction port, and
      the suction port of said pipe-shaped suction unit projects out from the jet port of said pipe-shaped jetting unit.

7. A cleaning apparatus as claimed in claim 6, wherein the suction port of said pipe-shaped suction unit projects out approximately 10 mm from the jet port of said pipe-shaped jetting unit.

8. A cleaning apparatus as claimed in claim 6, wherein a distance from the jet port of said pipe-shaped jetting unit to the structural object is set to be not more than 20 mm.

9. A cleaning apparatus as claimed in claim 6, wherein a distance from the suction port of said pipe-shaped suction unit to the structural object is set to be not more than 10 mm.

10. A cleaning apparatus that removes deposits attached to a structural object to clean the structural object, comprising:
    a pipe-shaped jetting unit adapted to jet out a mixture of a substance in gaseous form and the same substance in liquid form or solid form as the former toward the deposits; and
    a pipe-shaped suction unit adapted to suck the jetted mixture and the deposits to which the mixture has been jetted,
    wherein
       said pipe-shaped jetting unit further comprises a vibration-applied gas jetting unit adapted to apply a vibration to a gas and jet out the gas to the deposits,
       said pipe-shaped suction unit is adapted to suck the jetted vibration-applied gas and the deposits to which the vibration-applied gas has been jetted,
       said pipe-shaped suction unit coaxially accommodates said pipe-shaped jetting unit therein so that a jet port of said pipe-shaped jetting unit is surrounded by a suction port of said pipe-shaped suction unit and opens in the suction port, and
       the suction port of said pipe-shaped suction unit projects out from the jet port of said pipe-shaped jetting unit.

11. A cleaning apparatus as claimed in claim 10, wherein the suction port of said pipe-shaped suction unit projects out approximately 10 mm from the jet port of said pipe-shaped jetting unit.

12. A cleaning apparatus as claimed in claim 10, wherein a distance from the jet port of said pipe-shaped jetting unit to the structural object is set to be not more than 20 mm.

13. A cleaning apparatus as claimed in claim 10, wherein a distance from the suction port of said pipe-shaped suction unit to the structural object is set to be not more than 10 mm.

* * * * *